US012610464B2

(12) United States Patent
Subramanian

(10) Patent No.: US 12,610,464 B2
(45) Date of Patent: Apr. 21, 2026

(54) PCB LAND PAD FOR THREE-PIN MOSFET COMPONENT

(71) Applicant: Micron Technology, Inc., Boise, ID (US)

(72) Inventor: Shriram Harihara Subramanian, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 117 days.

(21) Appl. No.: 18/543,994

(22) Filed: Dec. 18, 2023

(65) Prior Publication Data

US 2024/0215162 A1     Jun. 27, 2024

Related U.S. Application Data

(60) Provisional application No. 63/457,581, filed on Apr. 6, 2023, provisional application No. 63/435,505, filed on Dec. 27, 2022.

(51) Int. Cl.
H05K 1/11 (2006.01)
H10D 30/69 (2025.01)

(52) U.S. Cl.
CPC .......... H05K 1/111 (2013.01); H10D 30/721 (2025.01); *H01L 2924/13091* (2013.01); *H05K 2201/10984* (2013.01)

(58) Field of Classification Search
CPC .................................................... H05K 1/111
USPC .......................................................... 361/767
See application file for complete search history.

(56) References Cited

U.S. PATENT DOCUMENTS

| | | | |
|---|---|---|---|
| 2011/0073943 A1* | 3/2011 | Hebert ................. | H10D 64/254 |
| | | | 257/E27.06 |
| 2013/0049137 A1 | 2/2013 | Uno et al. | |
| 2013/0133193 A1 | 5/2013 | Hsu et al. | |
| 2013/0323526 A1 | 12/2013 | Hasin et al. | |
| 2018/0331067 A1* | 11/2018 | Williams .......... | H01L 23/49555 |

OTHER PUBLICATIONS

"International Application Serial No. PCT US2023 084634, International Search Report mailed Apr. 19, 2024", 4 pages.
Pages. "International Application Serial No. PCT US2023 084634, Written Opinion mailed Apr. 19, 2024", 4 pgs.
"European Application Serial No. 23913480.2, Response to Communication pursuant to Rules 1612 and 162 EPC filed Feb. 3, 2026", 7 pages.

* cited by examiner

*Primary Examiner* — Stanley Tso
(74) *Attorney, Agent, or Firm* — Schwegman Lundberg & Woessner, P.A.

(57) ABSTRACT

A printed circuit board (PCB) land pad for a three-pin metal-oxide-semiconductor field-effect transistor (MOSFET) component comprises four pads with a split pad for a drain terminal of the MOSFET component. The PCB land pad comprises: a first pad to connect a gate terminal of the MOSFET component to a PCB; a second pad to connect a source terminal of the MOSFET component to the PCB; a third pad corresponding to connect a drain terminal of the MOSFET component to the PCB; and a fourth pad to connect the drain terminal of the MOSFET component to the PCB.

13 Claims, 4 Drawing Sheets

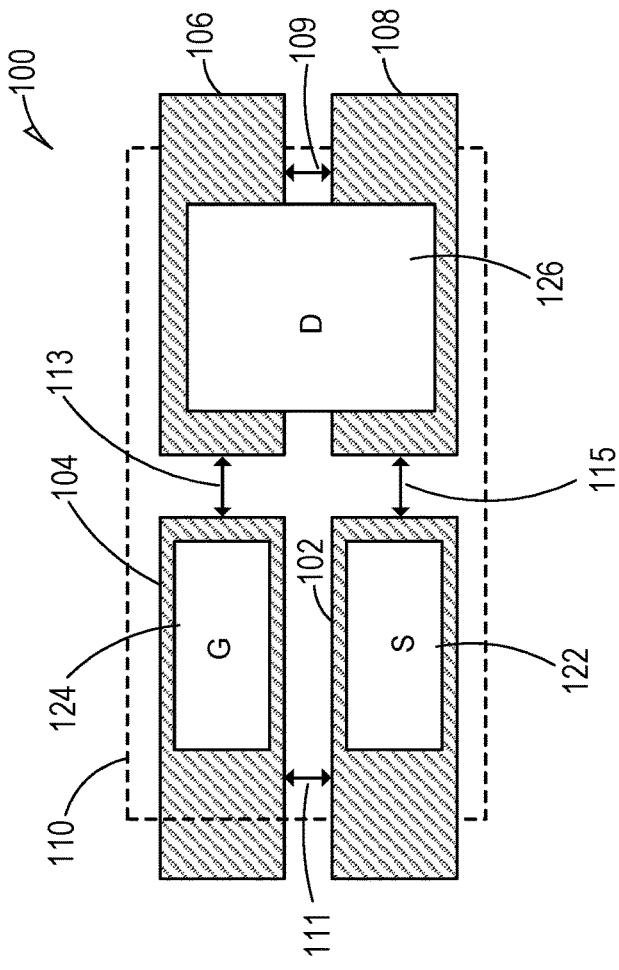
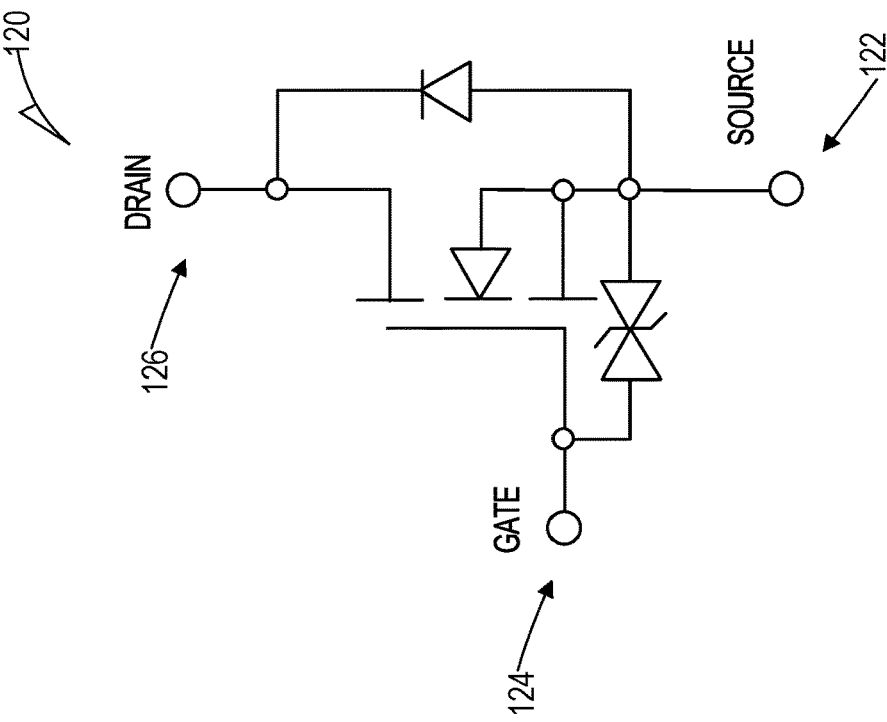
FIG. 1

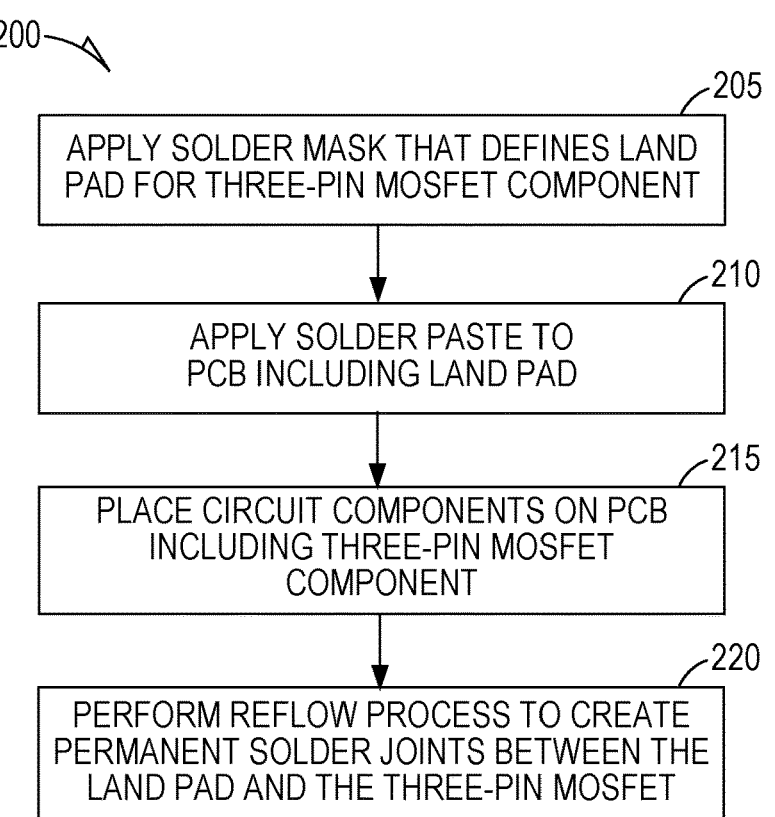

200

205
APPLY SOLDER MASK THAT DEFINES LAND
PAD FOR THREE-PIN MOSFET COMPONENT

210
APPLY SOLDER PASTE TO
PCB INCLUDING LAND PAD

215
PLACE CIRCUIT COMPONENTS ON PCB
INCLUDING THREE-PIN MOSFET
COMPONENT

220
PERFORM REFLOW PROCESS TO CREATE
PERMANENT SOLDER JOINTS BETWEEN THE
LAND PAD AND THE THREE-PIN MOSFET

FIG. 2

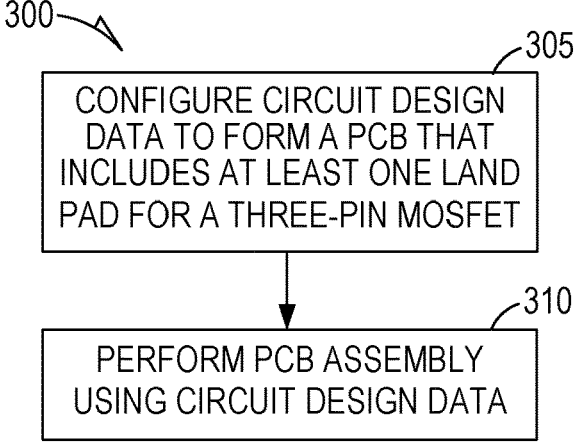

300

305
CONFIGURE CIRCUIT DESIGN
DATA TO FORM A PCB THAT
INCLUDES AT LEAST ONE LAND
PAD FOR A THREE-PIN MOSFET

310
PERFORM PCB ASSEMBLY
USING CIRCUIT DESIGN DATA

FIG. 3

PCB LAND PAD FOR THREE-PIN MOSFET COMPONENT

PRIORITY APPLICATION

This application claims the benefit of priority to U.S. Provisional Application Ser. No. 63/457,581, filed Apr. 6, 2023, and to U.S. Provisional Application Ser. No. 63/435, 505, filed Dec. 27, 2022, all of which are incorporated herein by reference in their entirety.

TECHNICAL FIELD

Embodiments of the disclosure relate generally to printed circuit boards (PCBs) and more specifically to a PCB land pad for an unsymmetrical three-pin metal-oxide-semiconductor field-effect transistor (MOSFET).

BACKGROUND

The MOSFET is the most ubiquitous form of transistor used in today's electronics. It can be classified into N type or P type MOSFET where electrons are the primary charge carries in N type and holes are the primary charge carriers in P type. Memory devices, such as solid-state drives (SSDs), use the MOSFET in the form of small outline transistor (SOT) in addition to the already used billions of transistors inside the die of memory cells. In this context, a MOSFET is used primarily to control conductivity between its source and drain terminals depending on the amount of voltage applied to its gate terminal.

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 1 is a diagram illustrating a PCB land pad for a three-pin MOSFET, in accordance with some embodiments of the present disclosure.

FIG. 2 is a flow diagram of an example method for assembly of a PCB that includes at least one PCB land pad for a three-pin MOSFET component, in accordance with some embodiments of the present disclosure.

FIG. 3 is a flow diagram of an example method for producing an assembled PCB based on a PCB that includes at least one PCB land pad for a three-pin MOSFET component, in accordance with some example embodiments of the present disclosure.

DETAILED DESCRIPTION

Figure 4:
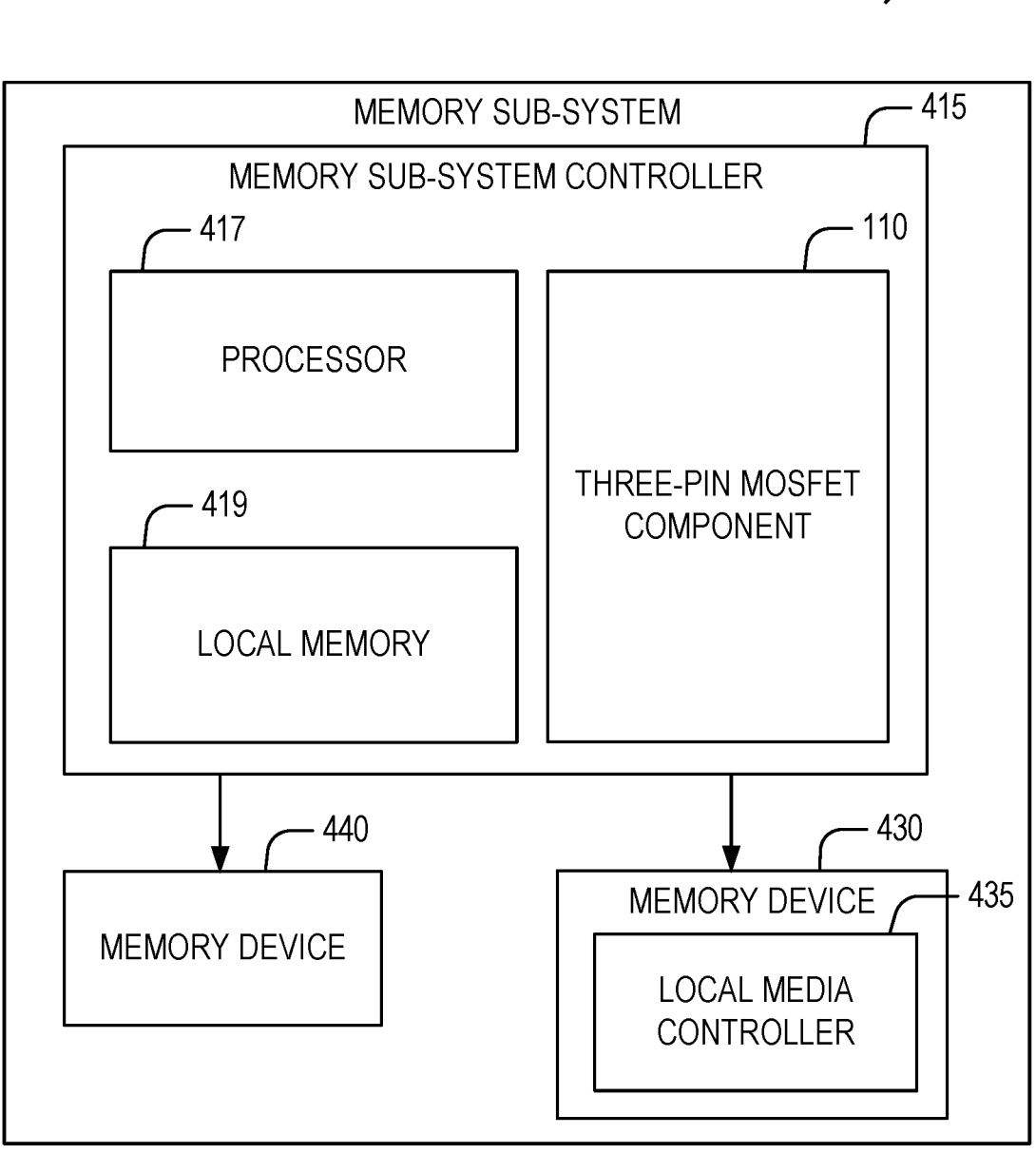
FIG. 4 is a diagram illustrating an example a memory sub-system, any one of more components of which may be implemented based on a PCB that includes at least one PCB land pad for a three-pin MOSFET component, in accordance with some embodiments of the present disclosure.

Aspects of the present disclosure are directed to a PCB land pad for an unsymmetrical three-pin MOSFET component. While the various embodiments described herein may be extended to any assembled PCB or PCB assembly process, one or more embodiments may find particular application within the context of PCBs that implement memory sub-systems. A memory sub-system can be a storage device (e.g., solid-state drive (SSD)), a memory module, or a combination of a storage device and memory module. Examples of other storage devices and memory modules are described below in conjunction with FIG. 4. In general, a host system can utilize a memory sub-system that includes one or more components, such as memory devices that store data. The host system can provide data to be stored at the memory sub-system and can request data to be retrieved from the memory sub-system. A memory sub-system controller typically receives commands or operations from the host system and converts the commands or operations into instructions or appropriate commands to achieve the desired access to the memory components of the memory sub-system.

A memory device can be a non-volatile memory device. One example of non-volatile memory devices is a negative-and (NAND) memory device. Other examples of non-volatile memory devices are described below in conjunction with FIG. 1. A NAND memory device can include multiple NAND dies. Each die may include one or more planes and each plane includes multiple blocks. Each block includes an array that includes pages (rows) and strings (columns). A string includes a plurality of memory cells connected in a series. A memory cell ("cell") is an electronic circuit (typically a transistor) that stores information. Depending on the cell type, a cell can store one or more bits of binary information and has various logic states that correlate to the number of bits being stored. The logic states can be represented by binary values, such as "0" and "1," or combinations of such values.

Various electronic devices, such as memory sub-systems (e.g., SSDs, DIMMs), are implemented using one or more printed circuit boards. Generally, assembly of a PCB includes a pick and place process where various circuit components are picked from a tape and reel or a tray and placed at specific points on the PCB and a reflow process where a forced convection oven is used to melt preplaced solder deposits to form reliable joints between components and the PCB. As used herein, an assembled PCB can refer to a PCB after one or more components are mounted to the PCB. An assembled PCB can include various circuit components that are soldered or otherwise connected to the PCB. The circuit components may include, for example, resistors, capacitors, inductors, transistors, fuses, Integrated Circuits (ICs) or chips, trim potentiometers (trim pots), electro-acoustic devices, micro-electromechanical devices (MEM), electro-optical devices, micro-processing chips, memory chips, multi-pin connectors, and various types of sensors, among others.

During the reflow process of PCB assembly, a circuit component may be soldered to one or more pads on the PCB. A pad is an exposed region of metal on a PCB that a component pin is soldered to. That is, pads serve as the designated surface area for electrical contact between the component and the board. A PCB land pad, as used herein, includes a set of pads designated for a particular component.

There are generally two types of pads—through-hole pads and surface mount pads. Through-hole pads are used to mount through-hole components. Surface mount pads are used to mount surface mount components. One type of surface mount pad is a solder mask-defined pad. A solder mask-defined pad is defined by solder mask apertures applied to the pads. These pads have the solder mask aperture such that the mask opening is smaller than the area of the pad they cover, which is performed to reduce the copper pad size that the circuit component will be soldered to.

As noted above, metal-oxide-semiconductor field-effect transistors (MOSFETs) are ubiquitous in electronics and are widely used in memory devices such as SSDs. MOSFET components typically include three pins (also referred to herein as "terminals") —a gate terminal, a drain terminal, and a source terminal. Conventionally, a PCB land pad with three pads is used to connect the MOSFET component to the PCB during assembly where each terminal of the MOSFET is connected to a single pad on the PCB. Typically, the pad for the drain terminal is much larger than the pads for the source and gate terminal.

The conventional three pad design for MOSFET PCB land pads can result in defects in the assembled PCB. These defects become more prevalent with miniature MOSFET components due to challenges with fabrication of PCB and component. For example, the conventional three-pad land pad design for miniature MOSFETs can cause an airgap mismatch between PCB pads and component terminal connections (also referred to herein as "component terminations"). An open solder joint can result from the airgap mismatch, which can be further amplified by the component shifting toward the larger drain termination during the reflow process of PCB assembly. Due to this component shift and uneven surface tension, the component can tilt and shift even more towards the drain pad thereby creating open solder joint defects at either the source or gate terminations of the MOSFET component.

Aspects of the present disclosure address the forgoing issues with conventional PCB land pads for MOSFETs by splitting the pad for the drain terminal of the MOSFET into two pads. That is, the present disclosure addresses an improved PCB land pad for three pin MOSFETs that includes four pads: a first pad to connect a gate terminal of a MOSFET to the PCB; a second pad to connect a source terminal of the MOSFET to the PCB; and a third and fourth pad to connect a drain terminal of the MOSFET to the PCB.

When compared with traditional land pad designs, with the four pad PCB land pad, the solder volume applied across the pads is more uniform (correlated mean), thereby balancing the surface tension across the four corners of the MOSFET component. As a result, the MOSFET component does not shift towards the drain terminal during the reflow process. Thus, the four pad PCB MOSFET land pad prevents the component from shifting and tilting thereby ensuring a quality solder joint. In addition, the four-pad design for the MOSFET land pad is solder mask defined. With the solder mask defining the pads, a uniform (correlated mean) standoff height is maintained across the four solder joints which helps to prevent component tilt.

Additionally, the uniform standoff height is beneficial for mechanical reliability of the assembly. For example, when comparing the four-pad design for the MOSFET land pad with conventional MOSFET land pads, the source and gate terminals pad size of conventional MOSFET land pads have a smaller area ratio with a current standard stencil thickness of 0.1 mm. The stencil thickness can be reduced (e.g., to 0.075 mm) to improve solder print yield (via better area ratio than 0.1 mm) to get better throughput and yield out of the surface mount line. However, a reduction of solder volume (e.g., by 25%) can impact the mechanical reliability (shear strength) of the assembly. By increasing the pad size relative to the conventional design for MOSFET land pads, as with the four-pad design for the MOSFET land pad, a better solder print aspect ratio can be achieved without overprinting the pads (e.g., using 0.1 mm thick stencil). This reduces defectivity by minimizing tilt and improves the mechanical reliability margin due to increased solder content in the joint.

FIG. 1 is a diagram illustrating a PCB land pad 100 for a three-pin MOSFET component 110 with bottom only termination, in accordance with some embodiments of the present disclosure. An equivalent MOSFET circuit 120 corresponding to the MOSFET component 110 is also shown in FIG. 1. The MOSFET circuit 120 includes a source terminal 122, a gate terminal 124, and a drain terminal 126.

Unlike conventional PCB land pads for three-pin MOSFET components that include a single pad for each terminal, the land pad 100 includes four pads with the pad for the drain terminal 126 being split into two. For example, as shown, the land pad 100 includes source pad 102, gate pad 104, drain pad 106, and drain pad 108. For some embodiments, the source pad 102, gate pad 104, drain pad 106, and drain pad 108 are uniform in size and arranged symmetrically with the source pad 102 and the gate pad 104 on the land pad 100.

For some embodiments, the land pad 100 is solder mask defined. That is, during PCB assembly a solder mask that defines the source pad 102, the gate pad 104, and the drain pad 106 and 108 of the land pad 100 is applied to a copper layer prior to application of solder paste. The solder mask further defines an air gap 109 that separates the drain pad 106 and the drain pad 108 and an air gap 111 between source pad 102 and gate pad 104. In some embodiments, the air gap 109 and the air gap 111 are identical. In addition, the solder mask further defines an air gap 113 that separates the gate pad 104 and the drain paid 106 and an airgap 115 that separates the source pad 102 and the drain pad 108.

For some embodiments, the air gaps 109 and 111 are approximately 0.15 mm and the air gaps 113 and 115 are approximately 0.3 mm with a standard manufacturing tolerance applicable to each during PCB fabrication (e.g., +/−35 μm). Consistent with these embodiments, the uniform length of each of the pads 102, 104, 106, and 108 is 0.45 mm and the uniform width of each of the pads 102, 104, 106, and 108 is 0.2 mm. Consistent with these embodiments, a solder paste stencil aperture with a vertical length of 0.4 mm, a horizontal length of 0.165 mm, and a fillet of 0.05 mm may be used for each of the pads 102, 104, 106, and 108 with an horizontal air gap of 0.175 mm and a vertical air gap of 0.31 mm separating each of the stencil apertures.

As noted above, each pad is an exposed region of metal on the PCB that a component terminal is soldered. Here, the source pad 102 is for connecting the source terminal 122 of the MOSFET component 110 to the PCB, the gate pad 104 is for connecting the gate terminal 124 of the MOSFET component 110 to the PCB, and the drain pads 106 and 108 are for connecting the drain terminal 126 of the MOSFET component 110 to the PCB.

During a placement process performed as part of PCB assembly, the MOSFET component 110 is placed on the land pad 100 as shown. More specifically, the source terminal 122 of the MOSFET component 110 is placed on the source pad 102, the gate terminal 124 of the MOSFET component 110 is placed on the gate pad 104, and the drain terminal 126 is placed on the drain pads 106 and 108.

During a reflow process performed as part of PCB assembly, the terminals of the MOSFET component 110 are soldered to the land pad 100. More specifically, the source terminal 122 of the MOSFET component 110 is soldered the source pad 102, the gate terminal 124 of the MOSFET component 110 is soldered to the gate pad 104, and the drain terminal 126 is soldered to the drain pads 106 and 108. The split pad design for the drain terminal 126 (i.e., the drain pads 106 and 108) balances the surface tension across the four corners of the MOSFET component 110 during reflow, thereby minimizing the MOSFET component 110 shift towards the drain terminal, which is further reduced given that the land pad 100 is solder mask defined. Overall, the reduced shift and tilt prevents open solder joint defects with the three pin MOSFET component 110.

FIG. 2 is a flow diagram of an example method 200 for assembly of a PCB that includes one or more PCB land pads (e.g., one of more of the land pads 100), in accordance with some embodiments of the present disclosure. The diagrams illustrated herein should be understood only as examples, and one or more processes can be omitted in various embodiments. Thus, not all processes are used in every embodiment; other process flows are possible.

At operation 205, a solder mask is applied to a copper layer of a PCB. The solder mask insulates copper traces from unintentionally contacting other conductive materials that can result in a short. The solder mask defines the PCB land pad for a surface mounted three-pin MOSFET component bottom only termination (referred to hereinafter as "three-pin MOSFET land pad"). With reference to the three-pin MOSFET land pad, the solder mask defines four pads where the pad for the drain terminal of the MOSFET component being split into two. For example, the three-pin MOSFET land pad includes source pad, a gate pad, and two drain pads. For some embodiments, the two drain pads are uniform in size and are arranged symmetrically with the source pad and the gate pad on the three-pin MOSFET land pad. For some embodiments, the solder mask defines an air gap of 0.15 mm separating the first drain pad and the second drain pad. Consistent with these embodiments, the solder mask further defines an air gap of 0.15 mm between the source pad and the drain pad.

At operation 210, solder paste is applied to the exposed copper land pad on PCB. As part of applying the solder paste to the PCB, a thin, stainless-steel or nickel stencil is placed over the PCB to allow assembler systems to apply solder paste only to certain parts of the PCB where components will sit in the assembled PCB (e.g., land pads).

In an example of the foregoing, a mechanical fixture holds the PCB and solder stencil in place, and applicator machine places solder paste on the intended areas in precise amounts. The applicator machine spreads the paste across the stencil, applying it evenly to every open area. Upon removing the stencil, the solder paste remains in the specific locations of the PCB land pads.

The application of the solder paste includes applying solder paste to the areas of the source pad, the gate pad, and the two drain pads of the three-pin MOSFET land pad to allow the terminals of a MOSFET component to be soldered to the corresponding pads. For some embodiments, a uniform (correlated mean) solder volume is applied to the source pad, the gate pad, and the two drain pads of the three-pin MOSFET land pad. For example, the stencil used in applying the solder paste may have uniformly sized apertures for the source pad, the gate pad, and the two drain pads of the three-pin MOSFET land pad. The uniform solder volume across the pads balances the surface tension across the four corners of the MOSFET component to prevent the component from shifting towards the drain terminal and tilting during the reflow process.

For some embodiments, stencil apertures are configured with air gap of 0.175 mm thus resulting in an air gap between solder paste deposits of the source pad and gate pad and between the first and second drain pads of the three-pin MOSFET land pad.

At operation 215, a component placement process is performed. During the component placement process, one or more circuit components are placed on specific areas on the PCB. Component placement may be done manually (e.g., by one or more humans), or it can be done with the assistance of machinery such as a pick and place machine. A pick and place device is a robotic device that places surface mount components on PCBs. In an example of the placement process, a pick and place device picks up a PCB with a vacuum grip and moves it to the pick and place station. The pick and place device (robot) orients itself to the PCB at the pick and place station and applies one or more surface mount component to the PCB surface.

As part of the component placement process, a three-pin MOSFET component (e.g., the MOSFET component 110) is placed on the land pad. More specifically, the source terminal of the MOSFET component is placed on the source pad, the gate terminal of the MOSFET component is placed on the gate pad, and the drain terminal is placed on the two drain pads.

At operation 220, a reflow process performed. The reflow process includes melting the solder in the solder paste and cooling it to create permanent solder joints between the circuit components and the PCB.

During the reflow process, the terminals of the MOSFET component 110 are soldered to the land pad 100. More specifically, the source terminal of the MOSFET component is soldered the source pad, the gate terminal of the MOSFET component is soldered to the gate pad, and the drain terminal is soldered to the first and second drain pads. The split pad design for the drain terminal (i.e., the two drain pads) along with uniformly sized, spaced source and gate pads, balances the surface tension across the four corners of the MOSFET component during reflow thereby preventing the MOSFET component from shifting towards the drain terminal and tilting thereby creating an open solder joint defect.

In an example of the reflow process performed at operation 220, the PCB along with the circuit components placed on the PCB (including the three-pin MOSFET component placed on the three-pin MOSFET land pad) are placed on a conveyer belt and moved through a reflow oven that heats the solder thereby liquifying it and ensuring that connections are formed between the PCB and the circuit components via the land pads. A reflow oven includes a series of heaters that gradually heat the board to temperatures that are sufficient to melt the solder in the solder paste (e.g., 250 degrees Celsius, or 480 degrees Fahrenheit). Upon melting the solder, the conveyer moves the PCB into a cooler, where the solder is cooled to control resolidification thereby creating a permanent solder joint to connect the circuit components to the PCB, the result of which is an assembled PCB with electrical interconnections.

In various embodiments, the assembled PCB may implement in whole or in part a memory sub-system, a memory device for storing data from a host system, or a memory sub-system controller that can be operatively coupled to one or more memory devices.

FIG. 3 is a flow diagram of an example method 300 for producing an assembled PCB based on a PCB that includes at least one land pad (e.g., the land pad 100) for a three-pin MOSFET component (with bottom only termination), in accordance with some example embodiments of the present disclosure. The method 300 can be performed with the assistance of processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed at least in part by a circuit design system (e.g., an electronic design automation (EDA) system). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are used in every embodiment. Other process flows are possible.

At operation 305, circuit design data is configured for forming (e.g., fabricating) a PCB that includes at least one PCB land pad for a surface mounted three-pin MOSFET component (referred to hereinafter as "three-pin MOSFET land pad"). With reference to the three-pin MOSFET land pad, the circuit design data defines four pads where the pad for the drain terminal of the MOSFET component is split into two. For example, the three-pin MOSFET land pad includes source pad, a gate pad, and two drain pads.

For some embodiments, the pads of the land pad are uniform in size. For some embodiments, the two drain pads are arranged symmetrically with the source pad and the gate pad on the three-pin MOSFET land pad. For some embodiments, the circuit design data defines an air gap of 0.15 mm separating the first drain pad and the second drain pad. Consistent with some of these embodiments, the circuit design data may also define an air gap of 0.15 mm between source and gate pads.

The circuit design data can be generated or configured by a circuit design system (e.g., an EDA system), which can assist in designing the PCB, designing the stencil, creation of inspection programs for pre reflow (post solder print and pre reflow) and post reflow and creating placement configuration for one or more circuit components on the PCB At operation 310, a PCB assembly process is performed using the circuit design data, a result of which is an assembled PCB. The PCB assembly process may include any one or more of the operations of the method 200 described above. As an example, the circuit design data can be used in configuring or creating a solder mask used in part to define the three-pin MOSFET land pad. As another example, the circuit design data can be used in configuring or creating a stencil used during solder paste application to apply solder to the four pads of the three-pin MOSFET land pad with a uniform volume of solder being applied to the four pads. As yet another example, the circuit design data can be used to instruct or control a pick and place device to place a surface mounted three pin MOSFET component on the three-pin MOSFET land pad, and/or create inspection recipes in Surface Mount Line to check the quality of solder volume post print and quality of solder joint post reflow.

FIG. 4 is a block diagram illustrating a memory sub-system 410 that can be implemented, at least in part, by an example printed circuit board, in accordance with some embodiments of the present disclosure. The memory sub-system 410 can include media, such as one or more volatile memory devices (e.g., memory device 440), one or more non-volatile memory devices (e.g., memory device 430), or a combination of such.

A memory sub-system 410 can be a storage device, a memory module, or a hybrid of a storage device and memory module. Examples of a storage device include an SSD, a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM) and its subclassification includes a small outline DIMM (SO-DIMM), registered DIMM (RDIMM) and various types of non-volatile dual in-line memory modules (NVDIMM).

The memory devices 430, 440 can include any combination of the different types of non-volatile memory devices and/or volatile memory devices. The volatile memory devices (e.g., memory device 440) can be, but are not limited to, random access memory (RAM), such as dynamic random access memory (DRAM) and synchronous dynamic random access memory (SDRAM).

Some examples of non-volatile memory devices (e.g., memory device 430) include NAND type flash memory and write-in-place memory, such as a three-dimensional cross-point (3D cross-point) memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and 3D NAND.

Each of the memory devices 430 can include one or more arrays of memory cells. One type of memory cell, for example, single level cells (SLC), can store one bit per cell. Other types of memory cells, such as multi-level cells (MLCs), triple level cells (TLCs), quad-level cells (QLCs), and penta-level cells (PLCs) can store multiple bits per cell.

Although non-volatile memory components such as NAND type flash memory (e.g., 2D NAND, 3D NAND) and 3D cross-point array of non-volatile memory cells are described, the memory device 430 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), NOR flash memory, and electrically erasable programmable read-only memory (EEPROM).

A memory sub-system controller 415 (or controller 415 for simplicity) can communicate with the memory device 430 to perform operations such as reading data, writing data, or erasing data at the memory device 430 and other such operations. The memory sub-system controller 415 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 415 can be a microcontroller, special purpose logic circuitry (e.g., a field programmable gate array (FPGA), an application specific integrated circuit (ASIC), etc.), or other suitable processors.

The memory sub-system controller 415 can include a processor 417 (processing device) configured to execute instructions stored in a local memory 419. In the illustrated example, the local memory 419 of the memory sub-system controller 415 includes an embedded memory configured to store instructions for performing various processes, operations, logic flows, and routines that control operation of the memory sub-system 410, including handling communications between the memory sub-system 410 and a host system.

In some embodiments, the local memory 419 can include memory registers storing memory pointers, fetched data, and the like. The local memory 419 can also include ROM for storing micro-code. While the example memory sub-system 410 in FIG. 4 has been illustrated as including the memory sub-system controller 415, in another embodiment of the present disclosure, a memory sub-system 410 does not include a memory sub-system controller 415, and can instead rely upon external control (e.g., provided by an external host, or by a processor or controller separate from the memory sub-system).

In general, the memory sub-system controller 415 can receive commands or operations from a host system and can convert the commands or operations into instructions or appropriate commands to achieve the desired access to the memory devices 430 and/or the memory device 440. The memory sub-system controller 415 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 430. The memory sub-system controller 415 can further include host interface circuitry to communicate with a host system via the physical host interface. The host interface circuitry can convert the commands received from the host system into command instructions to access the memory devices 430 and/or the memory device 440 and convert responses associated with the memory devices 430 and/or the memory device 440 into information for the host system.

As shown, the memory sub-system controller 415 includes at least one three-pin MOSFET component 110. As noted above, for some embodiments, the memory sub-system controller 415 can be implemented in whole or in part by a PCB that includes a four-pad land pad for the three-pin MOSFET component 110. In an example, the three-pin MOSFET component 110 of the memory sub-system controller 415 is connected (e.g., soldered) to an instance of the land pad 100 on the PCB that implements the memory sub-system controller 415 in whole or in part.

In some embodiments, the memory device 430 include local media controller 435 that operate in conjunction with memory sub-system controller 415 to execute operations on one or more memory cell of the memory device 430. It shall be appreciated that while FIG. 4 illustrates the memory sub-system controller 415 as including at least one three-pin MOSFET component 110, the local media controller 435 may also include at least one three-pin MOSFET component 110.

In view of the disclosure above, various examples are set forth below. It should be noted that one or more features of an example, taken in isolation or combination, should be considered within the disclosure of this application.

Example 1. A printed circuit board (PCB) land pad for a metal-oxide-semiconductor field-effect transistor (MOSFET) component comprising: a first pad to connect a gate terminal of the MOSFET component to a PCB; a second pad to connect a source terminal of the MOSFET component to the PCB; a third pad corresponding to connect a drain terminal of the MOSFET component to the PCB; and a fourth pad to connect the drain terminal of the MOSFET component to the PCB.

Example 2. The PCB land pad of Example 1, wherein the first, second, third, and fourth pad are solder mask defined.

Example 3. The PCB land pad of any one of Examples 1 or 2, wherein the first pad and the second pad are symmetrical with the third pad and the fourth pad.

Example 4. The PCB land pad of any one of Examples 1-3, wherein: a first air gap separates the third pad from the fourth pad; a second air gap separates the first pad from the second pad; and the first air gap and the second air gap are identical.

Example 5. The PCB land pad of any one of Examples 1-4, wherein the air gap is 0.15 mm.

Example 6. The PCB land pad of any one of Examples 1-5, wherein the MOSFET component is a three-pin surface mounted component with bottom only termination.

Example 7. The PCB land pad of any one of Examples 1-6, wherein each of the first pad, the second pad, the third pad, and the fourth pad comprise an exposed region of copper metal on a PCB.

Example 8. An assembled printed circuit board (PCB) comprising: a PCB comprising a land pad for a three-pin metal-oxide-semiconductor field-effect transistor (MOSFET) component, the land pad comprising a gate pad, a source pad, a first drain pad, and a second drain pad; and a three-pin MOSFET component soldered to the land pad of the PCB, the MOSFET component comprising a gate terminal, a source terminal, and a drain terminal, the gate terminal being soldered to the gate pad, the source terminal being soldered to the source pad, the drain terminal being soldered to the first drain pad and the second drain pad.

Example 9. The assembled PCB of Examples 8, wherein the land pad is solder mask defined.

Example 10. The assembled PCB of any one of Examples 8 or 9, wherein the gate pad and the source pad are symmetrical with the first drain pad and the second drain pad.

Example 11. The assembled PCB of any one of Examples 8-10, wherein an air gap separates the first drain pad from the second drain pad.

Example 12. The assembled PCB of any one of Examples 8-11, wherein a uniform solder volume is applied to the gate pad, the source pad, the first drain pad, and the second drain pad.

Example 13. The assembled PCB of Examples 8-12, wherein the MOSFET component is a three-pin surface mounted component with bottom only termination.

Example 14. A method for producing an assembled printed circuit board (PCB), the method comprising: applying a solder mask to a copper layer of a PCB, the solder mask defining a land pad for a metal-oxide-semiconductor field-effect transistor (MOSFET) component, the land pad comprising a gate pad, a source pad, a first drain pad, and a second drain pad, the MOSFET component comprising a gate terminal, a source terminal, and a drain terminal; applying solder paste to the solder masked copper layer, the applying of solder paste comprising applying solder paste to the gate pad, the source pad, the first drain pad, and the second drain pad; placing the MOSFET component on the land pad, the placing of the component on the land pad comprising placing the drain terminal of the MOSFET component on the first drain pad and the second drain pad; and creating permanent solder joints between the MOSFET component and the land pad, the creating of permanent solder joints comprising melting the solder paste to solder the drain terminal to the first drain pad and to the second drain pad.

Example 15. The method of Example 14, further comprising configuring circuit design data for forming the PCB that includes the land pad for the MOSFET component.

Example 16. The method of any one of Examples 14 or 15, wherein one or more of the applying of the solder mask, the applying of the solder paste, and the placing of the MOSFET component is based on the circuit design data.

Example 17. The method of any one of Examples 14-16, wherein the solder mask defines an air gap of 0.15 mm between the first drain pad and the second drain pad.

Example 18. The method of any one of Examples 14-17, wherein the applying of the solder paste to the gate pad, the source pad, the first drain pad, and the second drain pad includes applying a uniform solder volume to the gate pad, the source pad, the first drain pad, and the second drain pad.

Example 19. The method of any one of Examples 14-18, wherein the placing of the MOSFET component on the land pad comprises surface mounting the MOSFET component to the PCB.

Example 20. The method of any one of Examples 14-19, wherein the first drain pad and second drain pad are uniformly sized.

Figure 5:
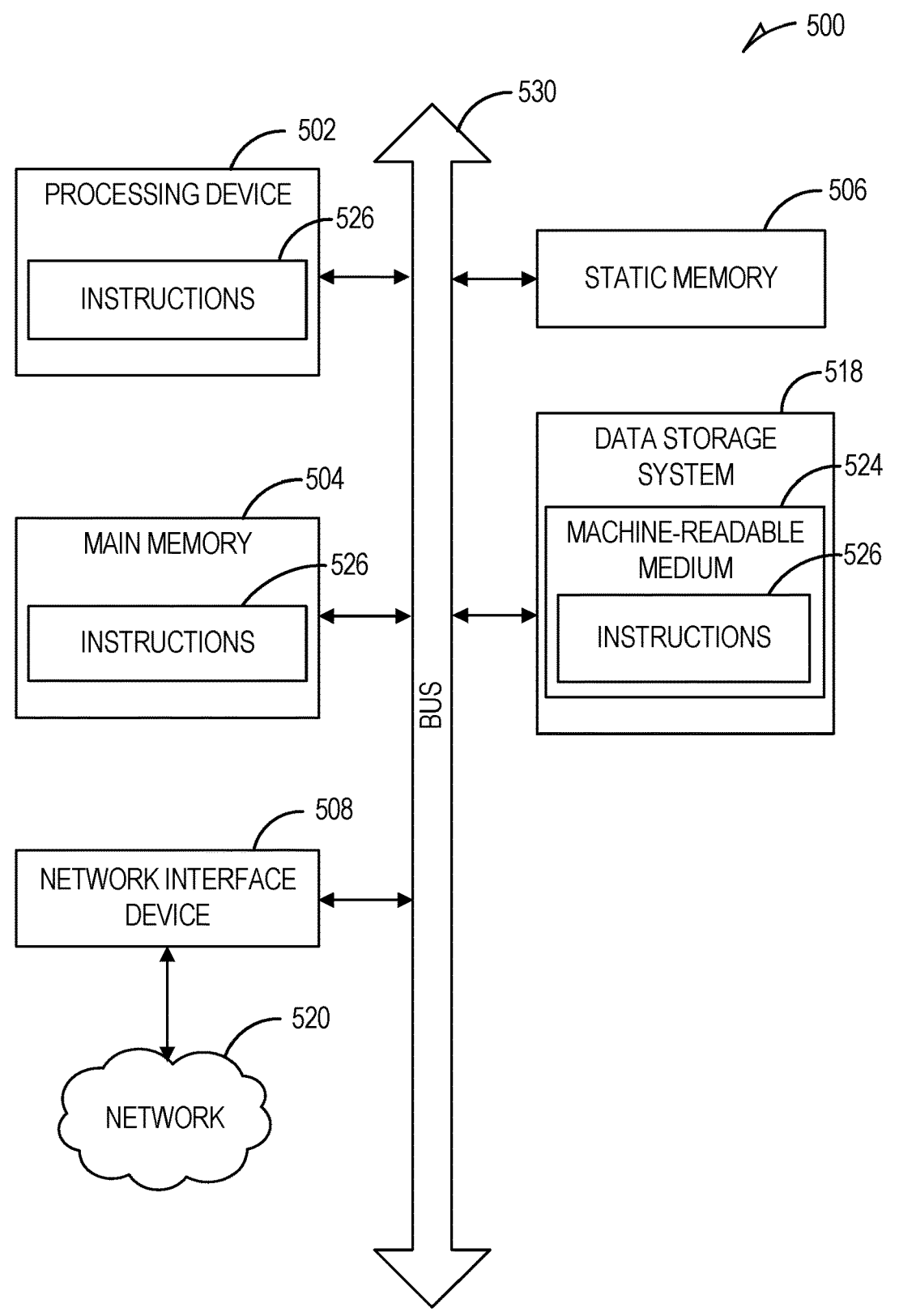
FIG. 5 illustrates an example machine in the form of a computer system within which a set of instructions can be executed for causing the machine to perform any one or more of the methodologies discussed herein.

FIG. 5 illustrates an example machine in the form of a computer system 500 within which a set of instructions can be executed for causing the machine to perform any one or more of the methodologies discussed herein. In some embodiments, the computer system 500 can be used to perform the operations of a controller. In alternative embodiments, the machine can be connected (e.g., networked) to other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., ROM, flash memory, DRAM such as SDRAM or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an ASIC, a FPGA, a digital signal processor (DSP), network processor, or the like. The processing device 502 is configured to execute instructions 526 for performing the operations and steps discussed herein. The computer system 500 can further include a network interface device 508 to communicate over a network 520.

The data storage system 518 can include a machine-readable storage medium 524 (also known as a computer-readable medium) on which is stored one or more sets of instructions 526, or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 410 of FIG. 4.

In one embodiment, the instructions 526 include instructions to implement functionality corresponding to implement functionality corresponding to configuring circuit design data for a PCB as described herein (e.g., the method 300 of FIG. 3). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to convey the substance of their work most effectively to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, ROMs, RAMs, EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a ROM, RAM, magnetic disk storage media, optical storage media, flash memory components, and so forth.

In the foregoing specification, embodiments of the disclosure have been described with reference to specific example embodiments thereof. It will be evident that various modifications can be made thereto without departing from the broader scope of embodiments of the disclosure as set forth in the following claims. The specification and drawings are, accordingly, to be regarded in an illustrative sense rather than a restrictive sense.

What is provisionally claimed is:

1. An assembled printed circuit board (PCB) comprising:
a PCB comprising a land pad for a three-pin metal-oxide-semiconductor field-effect transistor (MOSFET) component, the land pad comprising a gate pad, a source pad, a first drain pad, and a second drain pad; and
a three-pin MOSFET component soldered to the land pad of the PCB, the MOSFET component comprising a gate terminal, a source terminal, and a drain terminal, the gate terminal being soldered to the gate pad, the source terminal being soldered to the source pad, the drain terminal being soldered to the first drain pad and the second drain pad.

2. The assembled PCB of claim 1, wherein the land pad is solder mask defined.

3. The assembled PCB of claim 1, wherein the gate pad and the source pad are symmetrical with the first drain pad and the second drain pad.

4. The assembled PCB of claim 1, wherein an air gap separates the first drain pad from the second drain pad.

5. The assembled PCB of claim 1, wherein a uniform solder volume is applied to the gate pad, the source pad, the first drain pad, and the second drain pad.

6. The assembled PCB of claim 1, wherein the MOSFET component is a three-pin surface mounted component with bottom only termination.

7. A method for producing an assembled printed circuit board (PCB), the method comprising:
applying a solder mask to a copper layer of a PCB, the solder mask defining a land pad for a metal-oxide-semiconductor field-effect transistor (MOSFET) component, the land pad comprising a gate pad, a source pad, a first drain pad, and a second drain pad, the MOSFET component comprising a gate terminal, a source terminal, and a drain terminal;
applying solder paste to the solder masked copper layer, the applying of solder paste comprising applying solder paste to the gate pad, the source pad, the first drain pad, and the second drain pad;
placing the MOSFET component on the land pad, the placing of the component on the land pad comprising placing the drain terminal of the MOSFET component on the first drain pad and the second drain pad; and
creating permanent solder joints between the MOSFET component and the land pad, the creating of permanent solder joints comprising melting the solder paste to solder the drain terminal to the first drain pad and to the second drain pad.

8. The method of claim 7, further comprising configuring circuit design data for forming the PCB that includes the land pad for the MOSFET component.

9. The method of claim 8, wherein one or more of the applying of the solder mask, the applying of the solder paste, and the placing of the MOSFET component is based on the circuit design data.

10. The method of claim 7, wherein the solder mask defines an air gap of 0.15 mm between the first drain pad and the second drain pad.

11. The method of claim 7, wherein the applying of the solder paste to the gate pad, the source pad, the first drain pad, and the second drain pad includes applying a uniform solder volume to the gate pad, the source pad, the first drain pad, and the second drain pad.

12. The method of claim 7, wherein the placing of the MOSFET component on the land pad comprises surface mounting the MOSFET component to the PCB.

13. The method of claim 7, wherein the first drain pad and second drain pad are uniformly sized.

* * * * *